United States Patent
Ahn et al.

(10) Patent No.: US 6,754,112 B2
(45) Date of Patent: Jun. 22, 2004

(54) INTEGRATED CIRCUIT DEVICES HAVING DELAY CIRCUITS FOR CONTROLLING SETUP/DELAY TIMES OF DATA SIGNALS THAT ARE PROVIDED TO MEMORY DEVICES

(75) Inventors: Young-man Ahn, Kyungki-do (KR); Jin-ho So, Kyungki-do (KR); Byung-se So, Kyungki-do (KR); Seung-jin Seo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 51 days.

(21) Appl. No.: 10/074,309

(22) Filed: Feb. 11, 2002

(65) Prior Publication Data

US 2002/0114195 A1 Aug. 22, 2002

(30) Foreign Application Priority Data

Feb. 19, 2001 (KR) ........................................... 2001-8141

(51) Int. Cl.[7] ................................................. G11C 7/22
(52) U.S. Cl. ................... 365/194; 365/189.05; 365/233
(58) Field of Search ............................ 365/194, 189.05, 365/233

(56) References Cited

U.S. PATENT DOCUMENTS 5,946,712 A * 8/1999 Lu et al. ..................... 711/167
6,026,051 A * 2/2000 Keeth et al. ................ 365/233

FOREIGN PATENT DOCUMENTS

JP 01161912 A * 6/1989 ............ H03K/5/00

OTHER PUBLICATIONS

English Abstract of Japanese Pat. Pub. No. JP 01161912 A, Jun. 26, 1989 (JPO).*

* cited by examiner

Primary Examiner—Richard Elms
Assistant Examiner—J. H. Hur
(74) Attorney, Agent, or Firm—Myers Bigel Sibley & Sajovec, P.A.

(57) ABSTRACT

An integrated circuit device includes a delay circuit that is configured to delay a clock signal and is further configured to generate an output data signal in response to the delayed clock signal and an input data signal. Multiple devices are configured to respectively receive the output data signal in response to the clock signal.

13 Claims, 7 Drawing Sheets

INTEGRATED CIRCUIT DEVICES HAVING DELAY CIRCUITS FOR CONTROLLING SETUP/DELAY TIMES OF DATA SIGNALS THAT ARE PROVIDED TO MEMORY DEVICES

RELATED APPLICATION

This application claims the benefit of Korean Patent Application No. 2001-8141, filed Feb. 19, 2001, the disclosure of which is hereby incorporated herein by reference.

FIELD OF THE INVENTION

The present invention relates generally to integrated circuit devices and methods of operating same and, more particularly, to integrated circuit memory devices and methods of operating same.

BACKGROUND OF THE INVENTION

When applying input signals to multiple semiconductor memory devices, the effects of loading may need to be taken into account. A memory module may use a register to apply input signals to multiple semiconductor memory devices. The register may reduce the distortion in the input signals due to the load of the memory devices; however, because memory devices occupy different positions in a chip and/or a circuit board, the memory devices receive the input signals at different times. This is illustrated, for example, in FIG. 1.

FIG. 1 is a circuit diagram of a conventional memory module in which a register applies input signals to a plurality of semiconductor memory devices, and FIG. 2 is a timing diagram showing the operation of the memory module shown in FIG. 1. As shown in FIG. 1, a conventional memory module 100 comprises a plurality of semiconductor memory devices M1, M2, . . . , Mn, a register 120, and a phase-locked loop 130.

The phase-locked loop 130 generates a plurality of output clock signals OCLK1, OCLK2, . . . , OCLKn+1, which are in phase with each other, in synchronization with an input clock signal CLK. The register 120 generates output signals ACOUT in response to input signals ACIN and in synchronization with the output clock signal OCLK1. The register 130 may provide increased driving capability to account for the loading effects of the semiconductor memory devices M1, M2, . . . , Mn. The semiconductor memory devices M1, M2, . . . , Mn respectively receive the output signals ACOUT in synchronization with the output clock signals OCLK2, . . . , OCLKn+1.

Referring now to FIG. 2, transitions in the output signals ACOUT are synchronized with rising edges of the output clock signal OCLK1. Thus, as shown in FIG. 2, input signals ACIN are enabled when driven low, and the time that the input signals ACIN are enabled is different from the time that the output signals ACOUT are enabled. The length of time that the output signals ACOUT are enabled is equal to the period of the output clock signal OCLK1.

As shown in FIG. 2, the output signals ACOUT are delayed for variable lengths of time before they are applied to the plurality of semiconductor memory devices M1, M2, . . . , Mn. For example, semiconductor memory device Mn is closest to the register 120 and semiconductor memory device M1 is farthest from the register 120; therefore, the output signals ACOUT are received by semiconductor device Mn (illustrated by ACOUT_MN) before the output signals ACOUT are received by the semiconductor device M1 (illustrated by ACOUT_M1). Because the output signals ACOUT are generated in response to the input signals ACIN and in synchronization with the output clock signals OCLK1, OCLK2, . . . , OCLKn+1, which all have the same phase, the setup and hold times of the output signals ACOUT applied to the semiconductor memory devices M1, M2, . . . , Mn may not be within desired operating margins for one or more of the semiconductor memory devices M1, M2, . . . , Mn. The phase of the input clock signal CLK and the output clock signals OCLK1, OCLK2, . . . , OCLKn+1 may be pushed and/or pulled by controlling the capacitance of capacitors CAP1 and CAP2 to adjust the setup and hold times; however, the effectiveness of this approach may be limited. The register 120 generates the output signals ACOUT in response to the input signals ACIN and in synchronization with the output clock signal OCLK1. Moreover, the output signals OCLK2, . . . , OCLKn+1 are in phase with the output clock signal OCLK1 and are used by the semiconductor memory devices M1, M2, . . . , Mn to synchronize the reception of the output signals ACOUT. Thus, the plurality of semiconductor memory devices M1, M2, . . . , Mn may not affected by controlling setup and hold times of the first input signals ACIN.

SUMMARY OF THE INVENTION

According to embodiments of the present invention, an integrated circuit device comprises a delay circuit that is configured to delay a clock signal and is further configured to generate an output data signal in response to the delayed clock signal and an input data signal. Multiple devices are configured to respectively receive the output data signal in response to the clock signal. The multiple devices may comprise memory devices.

In other embodiments of the present invention, the delay circuit comprises a memory unit that is configured to store delay information therein and a delay buffer that is coupled to the memory unit and is configured to generate the delayed clock signal at an output terminal thereof in response to the delay information and the clock signal received at an input terminal thereof.

In still other embodiments of the present invention, the delay buffer comprises a plurality of buffers and a plurality of switches that are respectively operable to connect selected ones of the plurality of buffers in series between the input terminal and the output terminal of the delay buffer.

In still other embodiments of the present invention, the delay circuit further comprises a demultiplexer circuit that couples the memory unit to the delay buffer and is configured to generate a plurality of switch control signals. Respective ones of the plurality of switches are responsive to the respective ones of the plurality of switch control signals.

In still other embodiments of the present invention, the delay circuit further comprises a receiver circuit that is configured to store the input data signal and to generate the output data signal in response to the delayed clock signal and the stored input data signal.

In still other embodiments of the present invention, an input terminal is coupled to both the receiver circuit and the memory unit and is configured to receive the input data signal and the delay information therethrough.

In still other embodiments of the present invention, a clock generation circuit is configured to generate the clock signal in response to an input clock signal. The clock generation circuit may be a phase locked loop circuit.

In further embodiments of the present invention, an integrated circuit device comprises a delay circuit that is configured to receive an input data signal in response to a clock signal and is further configured to generate an output data signal by delaying the input data signal. Multiple devices are configured to respectively receive the output data signal in response to the clock signal. The multiple devices may comprise memory devices.

In still further embodiments of the present invention, an integrated circuit device comprises a plurality of delay circuits that are respectively configured to delay a clock signal so as to generate a plurality of output clock signals having differing phases. A storage circuit is configured to generate an output data signal in response to an input data signal and one of the plurality of output clock signals. Multiple devices are configured to respectively receive the output data signal in response to respective other ones of the plurality of output clock signals.

Although embodiments of the present invention have been described above primarily with respect to apparatus embodiments, embodiments of methods of operating integrated circuit devices are also provided.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE PREFERRED EMBODIMENTS

Figure 1:
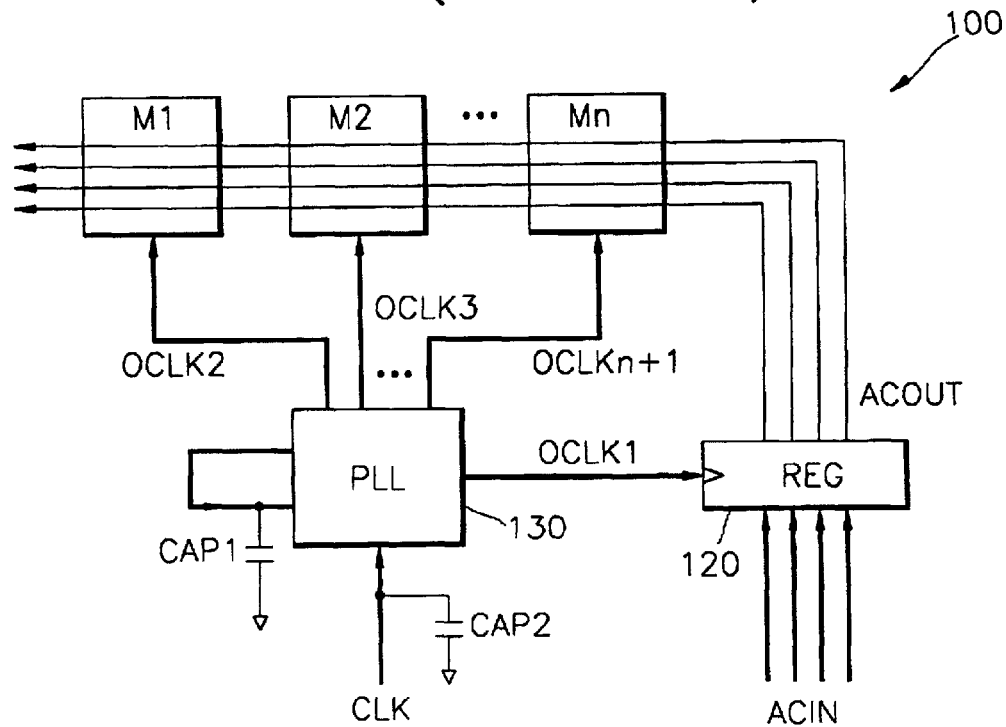
FIG. 1 is a block diagram that illustrates a conventional memory module.
Figure 2:
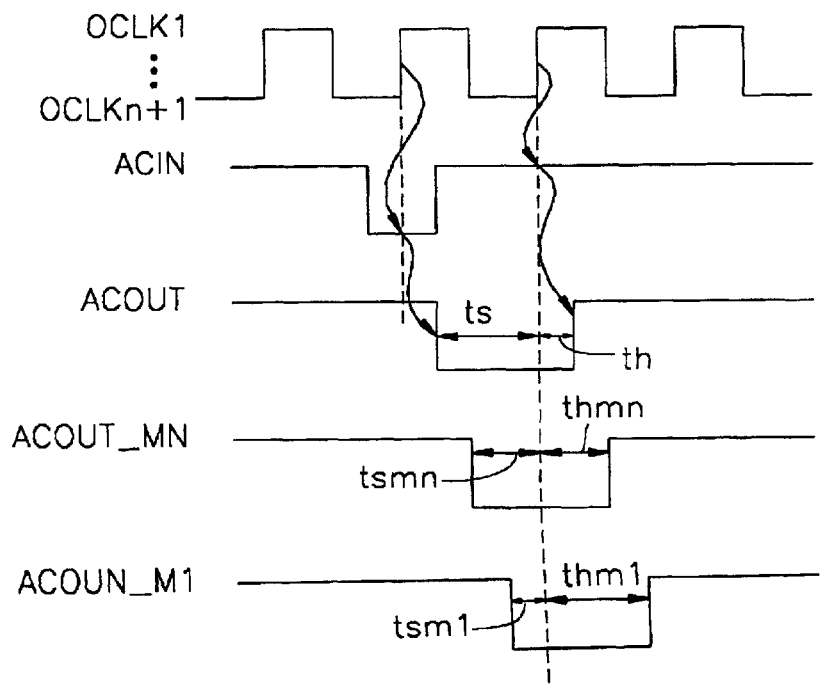
FIG. 2 is a timing diagram that illustrates operation of the memory module of FIG. 1.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present.

Figure 3:
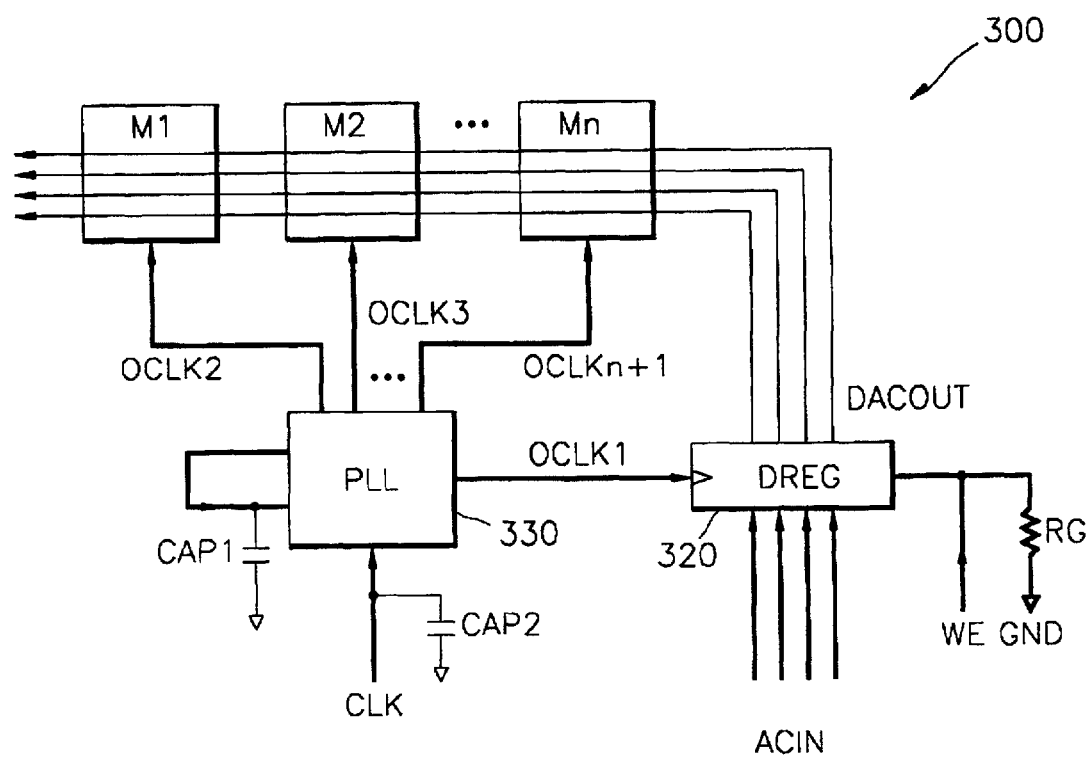
FIG. 3 is a block diagram of an integrated circuit memory module in accordance with embodiments of the present invention.

Referring now to FIG. 3, an integrated circuit memory module 300, in accordance with embodiments of the present invention, comprises a phase-locked loop (PLL) circuit 330, a delay register (DREG) 320, and a plurality of semiconductor memory devices M1, M2, ..., Mn. The phase-locked loop circuit 330 generates a plurality of output clock signals OCLK1, OCLK2, ..., OCLKn+1, which are in phase with each other, in synchronization with an input clock signal CLK. Because the output clock signals OCLK1, OCLK2, ..., OCLKn+1 are in phase with one another, they may be viewed as a single signal that is distributed to multiple destinations. The delay register 320 generates delayed output signals DACOUT in response to input signals ACIN and in response to the first output clock signal OCLK1. The input signals ACIN may be address signals and/or command signals in accordance with embodiments of the present invention. The delay register 320 may provide increased driving capability to account for the loading effects of the semiconductor memory devices M1, M2, ..., Mn. The semiconductor memory devices M1, M2, ..., Mn respectively receive the delayed output signals DACOUT in synchronization with the output clock signals OCLK2, ..., OCLKn+1.

Exemplary operations of the integrated circuit memory module 300, in accordance with embodiments of the present invention, will now be described with reference to FIG. 3. A capacitor CAP1 of a feedback loop is adjusted to allow the phase-locked loop 330 to synchronize the input clock signal CLK with the plurality of output clock signals OCLK1, OCLK2, OCLK3, ..., OCLKn+1 so that the input clock signal CLK and the plurality of output clock signals OCLK1, OCLK2, OCLK3, ..., OCLKn+1 have the same phase. The delay register 320 receives input signals ACIN, which may have a small margin due to a reduction in setup and/or hold times, in synchronization with the first output clock signal OCLK1. In more detail, the delay register 320 delays the first output clock signal OCLK1 to generate an internal output clock signal, and generates the delayed output signals DACOUT in response to the input signals ACIN and in synchronization with the internal output clock signal.

Thus, if the hold time characteristics of the semiconductor memory devices M1, M2, ..., Mn are better than the setup time characteristics of the semiconductor memory devices M1, M2, ..., Mn (i.e., if the semiconductor memory devices M1, M2, ..., Mn may operate normally even though hold time is relatively short), then the delay register 320 may increase the setup time of the delay output signals DACOUT. This may improve the operational stability of the semiconductor memory devices M1, M2, ..., Mn. Conversely, the delay register may increase the hold time of the delay output signals DACOUT if the setup time characteristics of the semiconductor memory devices M1, M2, ..., Mn are better than the hold time characteristics of the semiconductor memory devices M1, M2, ..., Mn. In general, setup and/or hold times of the delayed output signals DACOUT may be adjusted to improve the operational stability of the semiconductor memory devices M1, M2, ..., Mn.

Accordingly, when the information embodied in the input signals ACIN is provided to the semiconductor memory devices M1, M2, ..., Mn through the delayed output signals DACOUT, setup and hold times of the input signals ACIN, which are reduced, may be corrected. As a result, malfunctions in the semiconductor memory devices M1, M2, ..., Mn may be reduced.

Figure 4:
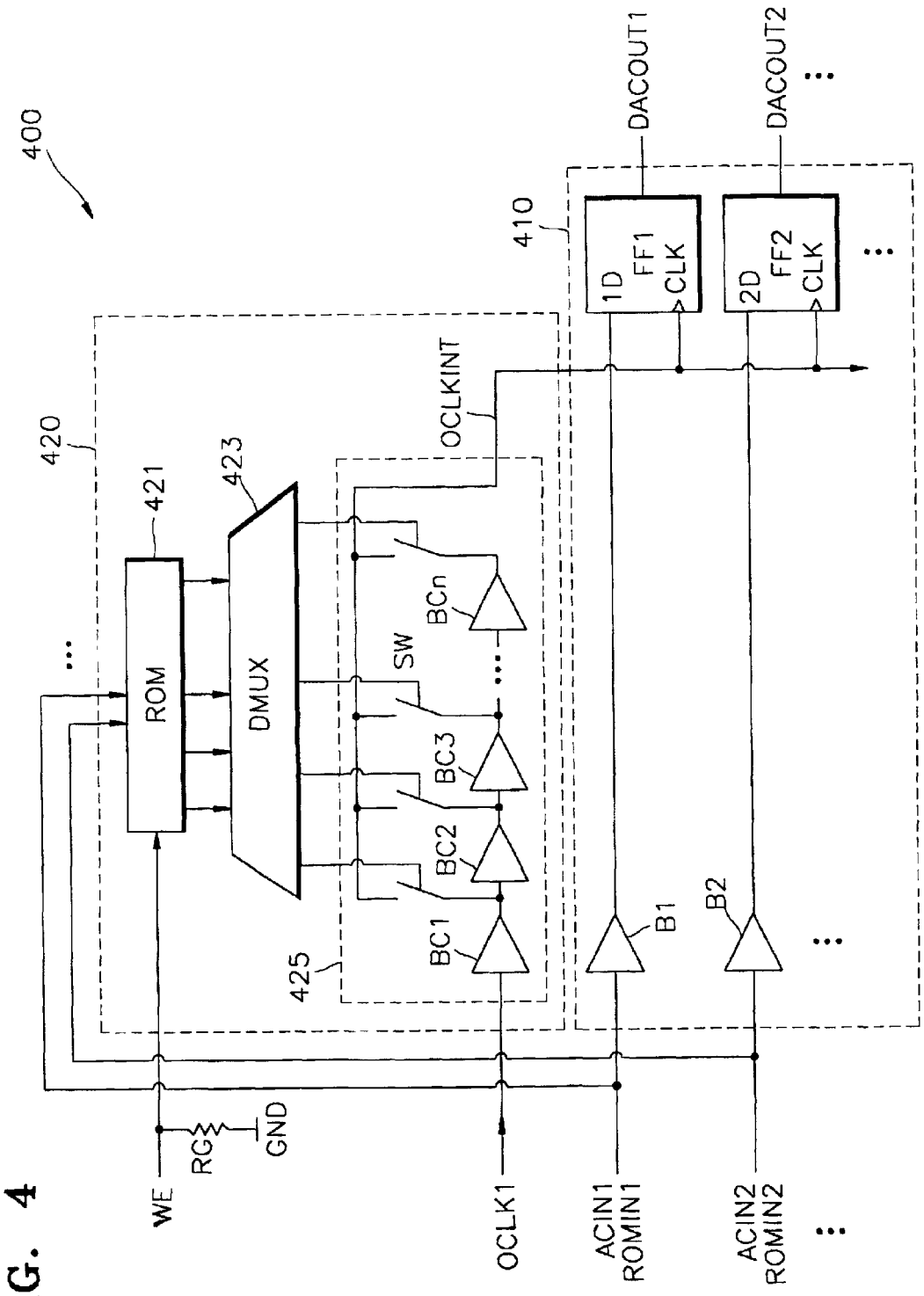
FIG. 4 is a circuit diagram of a delay register for use in the integrated circuit memory module of FIG. 3 in accordance with embodiments of the present invention.

Referring now to FIG. 4, a delay register 400 that may be used to implement the delay register 320 of FIG. 3 comprises a receiver 410 and a delay module 420, in accordance with embodiments of the present invention. The receiver 410 generates delayed output signals DACOUT1 and DACOUT2 in response to input signals ACIN1 and ACIN2 and in synchronization with an internal output clock signal OCLKINT. In the exemplary embodiment shown in FIG. 4, the number of input signals ACIN1 and ACIN2 is the same as the number of delayed output signals DACOUT1 and DACOUT2.

The delay module 420 comprises a ROM 421, a demultiplexer 423, and a delay buffer 425. The ROM 421 receives and stores the ROM input signals ROMIN1 and ROMIN2, which carry information on desired delay time, in response to a write control signal WE. The demultiplexer 423 generates a plurality of switch control signals based on the desired delay time information stored in the ROM 421. The delay buffer 425 comprises a plurality of buffers BC1, BC2, ... BCn and a plurality of switches that are respectively operable in response to the switch control signals output from the demultiplexer 423 to connect selected ones of the plurality of buffers BC1, BC2, ... BCn in series between the input terminal and the output terminal of the delay buffer 425. The delay buffer 425 generates an internal output clock signal OCLKINT, which is variably delayed based on the delay time information stored in the ROM 421, in response to the output clock signal OCLK1.

Exemplary operations of the delay register 400, in accordance with embodiments of the present invention, will now be described with reference to FIG. 4. If the setup and hold times of the input signals ACIN1 and ACIN2 are sufficient to ensure stable operation of an integrated circuit memory module, then the write control signal WE may be driven to a low logic level through the resistor RG to disable operation of the delay module 420 and allow the integrated circuit memory module to operate normally.

If, however, the margins of the setup and hold times are reduced to a reduction in setup and hold times of the input signals ACIN1 and ACIN2, then the write control signal WE is driven to a high logic level to allow the ROM 421 to receive the input signals ROMIN1 and ROMIN2, which carry information on the desired delay time. In accordance with embodiments of the present invention, the ROM input signals ROMIN1 and ROMIN2 share input pins with the input signals ACIN1 and ACIN2, which are applied to the receiver 410. The ROM input signals ROMIN1 and ROMIN2 are selected when the write control signal WE is at a logic high level and the input signals ACIN1 and ACIN2 are selected when the write control signal WE is at a logic low level. It will be understood, however, that, in accordance with other embodiments of the present invention, different logic levels of the write control signal WE may be used to allow the selection of the ROM input signals ROMIN1 and ROMIN2 and/or the input signals ACIN1 and ACIN2.

The ROM input signals ROMIN1 and ROMIN2, which carry information on the desired delay time for delaying the delayed output signals DACOUT1 and DACOUT2 relative to the input signals ACIN1 and ACIN2, respectively, are written to the ROM 421. A program may provide the delay time information, which is carried by the ROM input signals ROMIN1 and ROMIN2. The ROM 421 is connected to the demultiplexer 423, which generates output signals corresponding to the desired delay time in response to signals output from the ROM 421. Signals output from the demultiplexer 423 are applied to the delay buffer 425, which comprises a plurality of buffers BC1, BC2, BC3, ..., BCn.

The signals output from the demultiplexer 423 operate a plurality of switches, which are connected to the plurality of buffers BC1, BC2, BC3, ..., BCn to connect selected ones of the plurality of buffers BC1, BC2, BC3, ..., BCn in series between the input terminal and the output terminal of the delay buffer 425 to delay the internal output clock signal OCLKINT relative to the first output clock signal OCLK1. The internal output clock signal OCLKINT is then used to drive the flip-flops FF1 and FF2 in the receiver 410.

The receiver 410 generates the delayed output signals DACOUT1 and DACOUT2 in response to the input signals ACIN1 and ACIN2 and in synchronization with the internal output clock signal OCLKINT. Buffers B1 and B2 in the receiver 410 may be used to increase the driving capability of the receiver 410 to account for loading effects of, for example, semiconductor devices that are destined to receive the delayed output signals DACOUT1 and DACOUT2.

In other words, the output signals DACOUT1 and DACOUT2 are generated in synchronization with the internal output clock signal OCLKINT, which is a delayed version of the first output clock signal OCLK1. The ROM input signals ROMIN1 and ROMIN2 written to the ROM 421 are adjusted to control the delay between the internal output clock signal OCLKINT and the first output clock signal OCLK1. Thus, a reduction in the margin due to a reduction in setup and hold times of the input signals ACIN1 and ACIN2 may be corrected to prevent malfunctions in the semiconductor memory devices M1, M2, ..., Mn as will now be described with reference to FIG. 5.

Figure 5:
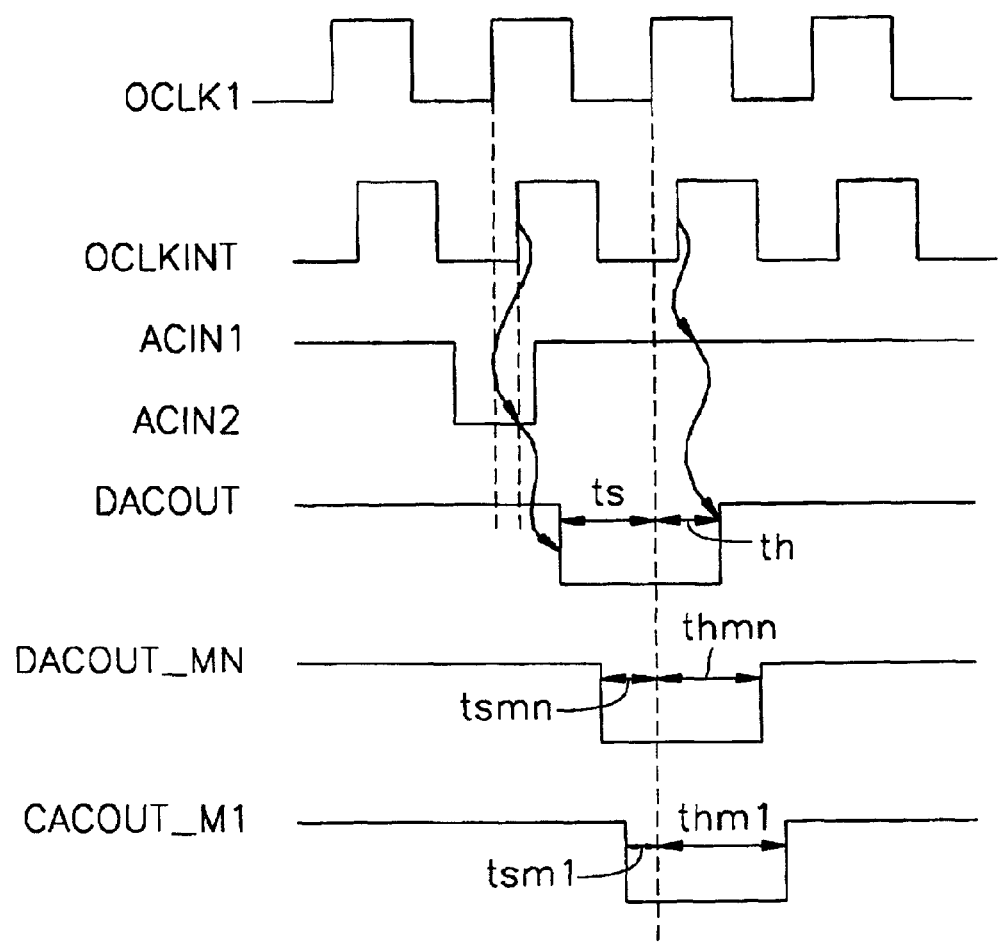
FIG. 5 is a timing diagram that illustrates operations of the integrated circuit memory module and the delay circuit of FIGS. 3 and 4 in accordance with embodiments of the present invention.

Referring now to FIG. 5, in the case where the delayed output signals DACOUT1 and DACOUT2 are synchronized with the internal output clock signal OCLKINT, which is a delayed version of the first output clock signal OCLK1, setup and hold times may be adjusted to improve the operational stability of an integrated circuit memory module. For example, as shown in FIG. 5, the hold times thmn and thm1 for semiconductor memory devices M1 and Mn, respectively, have been increased due to the delay applied to the output signal DACOUT relative to the input signals ACIN1 and ACIN2. It will be understood that, in accordance with embodiments of the present invention, a different delay may be applied to the delayed output signal DACOUT relative to the input signals ACIN1 and ACIN2 to increase the setup times tsmn and tsm1 for the semiconductor memory devices M1 and Mn, respectively.

Figure 6:
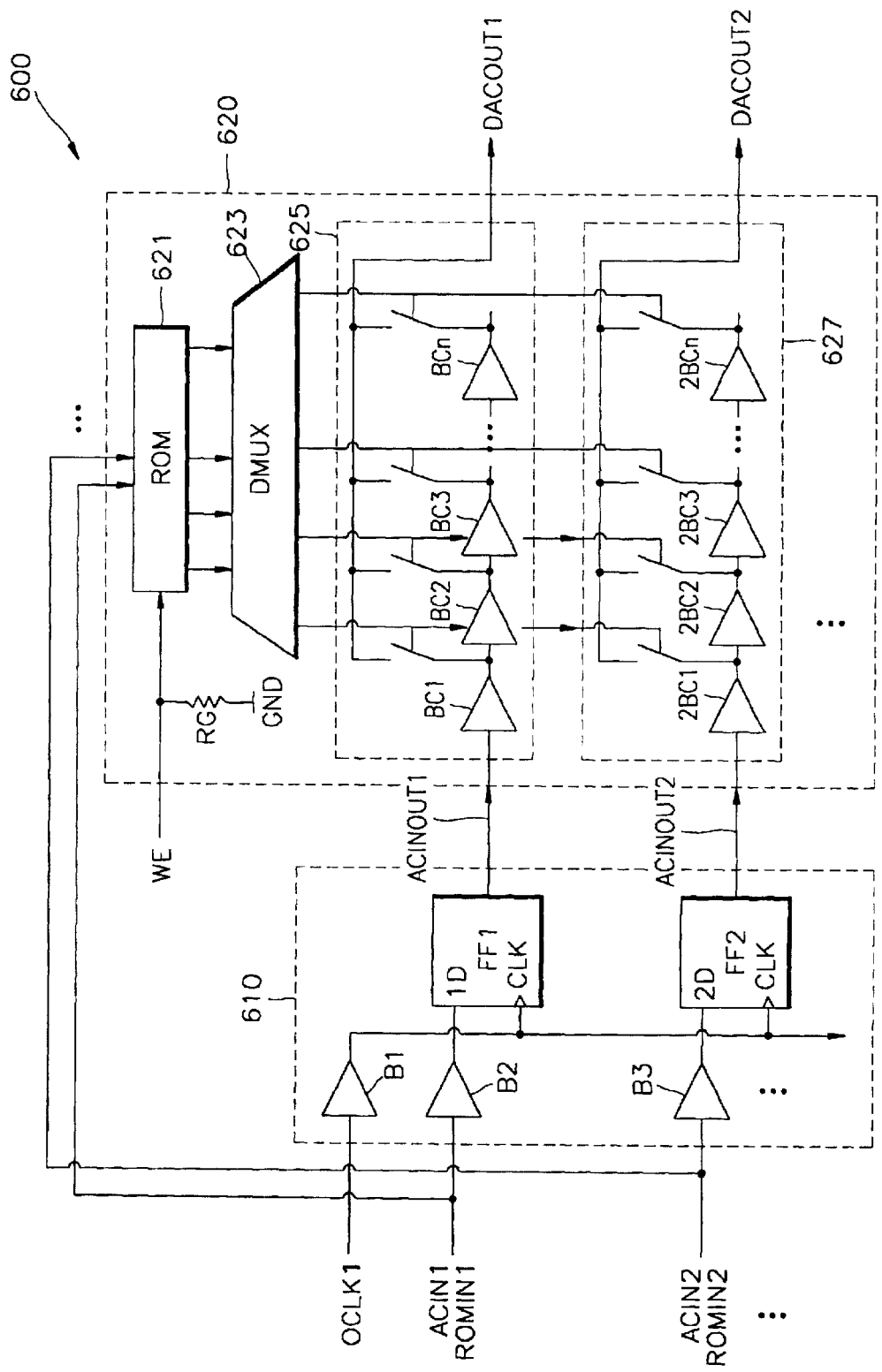
FIG. 6 is a circuit diagram of a delay register for use in the integrated circuit memory module of FIG. 3 in accordance with further embodiments of the present invention.

Referring now to FIG. 6, a delay register 600 that may be used to implement the delay register 320 of FIG. 3 comprises a receiver 610 and a delay module 620, in accordance with other embodiments of the present invention. The receiver 610 generates internal output signals ACINOUT1 and ACINOUT2 in response to input signals ACIN1 and ACIN2 and in synchronization with the first output clock signal OCLK1. In the exemplary embodiment shown in FIG. 6, the number of input signals ACIN1 and ACIN2 is the same as the number internal output signals ACINOUT1 and ACINOUT2.

The delay module 620 comprises a ROM 621, a demultiplexer 623, a first delay buffer 625 and a second delay buffer 627. The ROM 621 receives and stores the ROM input signals ROMIN1 and ROMIN2, which carry information on desired delay time, in response to a write control signal WE. The demultiplexer 623 generates a plurality of switch control signals based on the desired delay time information stored in the ROM 621. The delay buffer 625 comprises a plurality of buffers BC1, BC2, . . . BCn and a plurality of switches that are respectively operable in response to the switch control signals output from the demultiplexer 623 to connect selected ones of the plurality of buffers BC1, BC2, . . . BCn in series between the input terminal and the output terminal of the delay buffer 625. The delay buffer 625 generates the delayed output signal DACOUT1, which is variably delayed based on the delay time information stored in the ROM 621, in response to the internal output signal ACINOUT1. The delay buffer 627 comprises a plurality of buffers 2BC1, 2BC2, . . . 2BCn and a plurality of switches that are respectively operable in response to the switch control signals output from the demultiplexer 623 to connect selected ones of the plurality of buffers 2BC1, 2BC2, . . . 2BCn in series between the input terminal and the output terminal of the delay buffer 627. The delay buffer 627 generates the delayed output signal DACOUT2, which is variably delayed based on the delay time information stored in the ROM 621, in response to the internal output signal ACINOUT2.

Exemplary operations of the delay register 600, in accordance with embodiments of the present invention, will now be described with reference to FIG. 6. The structure and functionality provided by the delay register 600 are similar to that of the delay register 400 described above. Accordingly, emphasis will be placed on describing differences between operations of the delay register 600 and the delay register 400.

The delay register 400 shown in FIG. 4 delays the first output clock signal OCLK1 to generate the internal output clock signal OCLKINT and then generates the delayed output signals DACOUT in response to the input signals ACIN and in synchronization with the internal output clock signal OCLKINT. The delay register 600 shown in FIG. 6 generates internal output signals ACINOUT in response to the input signals ACIN and in synchronization with the first output clock signal OCLK1. The delay register 600 then generates the delayed output signals DACOUT by variably delaying the internal output signals ACINOUT.

The receiver 610 generates the internal output signals ACINOUT1 and ACINOUT2 in response to the input signals ACIN1 and ACIN2 and in synchronization with the first output clock signal OCLK1. Buffers B1, B2 and B3 in the receiver 610 may be used to increase the driving capability of the receiver 610 with respect to the first output clock signal OCLK1 and the input signals ACIN1 and ACIN2.

The ROM input signals ROMIN1 and ROMIN2, which carry information on the desired delay time for delaying the delayed output signals DACOUT1 and DACOUT2 relative to the internal output signals ACINOUT1 and ACINOUT2, respectively, are written to the ROM 621. A program may provide the delay time information, which is carried by the ROM input signals ROMIN1 and ROMIN2. The ROM 621 is connected to the demultiplexer 623, which generates output signals corresponding to the desired delay time in response to signals output from the ROM 621. Signals output from the demultiplexer 623 are applied to the delay buffer 625, which comprises a plurality of buffers BC1, BC2, BC3, . . . , BCn, and the delay buffer 627, which comprises a plurality of buffers 2BC1, 2BC2, 2BC3, . . . , 2BCn. The number of delay buffers 625 and 627 corresponds to the number of internal output signals ACINOUT1 and ACINOUT2, in accordance with embodiments of the present invention.

The signals output from the demultiplexer 623 operate a plurality of switches, which are connected to the plurality of buffers BC1, BC2, BC3, . . . , BCn to connect selected ones of the plurality of buffers BC1, BC2, BC3, . . . , BCn in series between the input terminal and the output terminal of the delay buffer 625 to delay the delayed output signal DACOUT1 relative to the internal output signal ACINOUT1. Similarly, the signals output from the demultiplexer 623 operate a plurality of switches, which are connected to the plurality of buffers 2BC1, 2BC2, 2BC3, . . . , 2BCn to connect selected ones of the plurality of buffers 2BC1, 2BC2, 2BC3, . . . , 2BCn in series between the input terminal and the output terminal of the delay buffer 627 to delay the delayed output signal DACOUT2 relative to the internal output signal ACINOUT2.

The ROM input signals ROMIN1 and ROMIN2 written to the ROM 621 may be adjusted to control the timing between the application of the delayed output signals DACOUT to the memory devices M1, M2, . . . , Mn and the output clock signals OCLK2, . . . , OCLKn+1. Thus, a reduction in the margin due to a reduction in setup and hold times of the input signals ACIN1 and ACIN2 may be corrected to prevent malfunctions in the semiconductor memory devices M1, M2, . . . , Mn.

Figure 7:
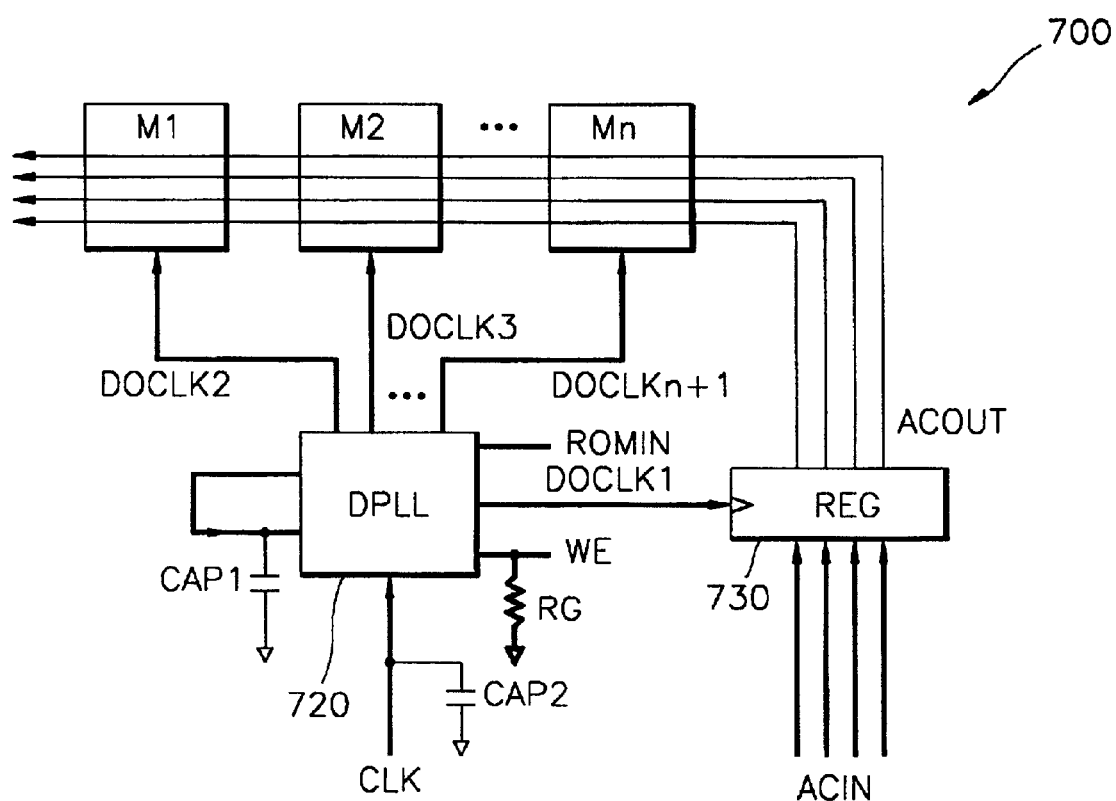
FIG. 7 is a block diagram of an integrated circuit memory module in accordance with further embodiments of the present invention.

Referring now to FIG. 7, an integrated circuit memory module 700, in accordance with other embodiments of the present invention, comprises a delay phase-locked loop (PLL) circuit 720, a register 730, and a plurality of semiconductor memory devices M1, M2, . . . , Mn. The delay phase-locked loop 720 receives a ROM input signal ROMIN, which carries information on desired delay time, in response to a write control signal WE. The delay phase-locked loop circuit 720 generates a plurality of delay output clock signals DOCLK1, DOCLK2, . . . , DOCLKn+1, which are out of phase with each other (or delayed relative to each other), in response to an input clock signal CLK. The register 730 generates output signals ACOUT in response to input signals ACIN and in response to the first delay output clock signal DOCLK1. The input signals ACIN may be address signals and/or command signals in accordance with embodiments of the present invention. The register 730 may provide increased driving capability to account for the loading effects of the semiconductor memory devices M1, M2, . . . , Mn. The semiconductor memory devices M1, M2, . . . , Mn respectively receive the output signals ACOUT in synchronization with the delay output clock signals DOCLK2, . . . , DOCLKn+1.

Exemplary operations of the integrated circuit memory module 700, in accordance with embodiments of the present invention, will now be described with reference to FIG. 7. In embodiments of the present invention described above with reference to FIGS. 3–6, the output signals DACOUT may be variably delayed to control the timing between the application of the delayed output signals DACOUT to the memory devices M1, M2, . . . , Mn and the output clock signals OCLK2, . . . , OCLKn+1. In accordance with embodiments of the present invention illustrated in FIG. 7, the delay output clock signals DOCLK2, DOCLK3, . . . , DOCLKn+1 of the delay phase-locked loop 720, each having a different delay time relative to each other, are respectively applied to the plurality of semiconductor memory devices M1, M2, . . . , Mn. Similar to the embodiments described above with reference to FIGS. 3–6, the integrated circuit memory module 700 may allow a reduction in the margin due to a reduction in setup and hold times of the input signals ACIN to be corrected to prevent malfunctions in the semiconductor memory devices M1, M2, . . . , Mn, in accordance with embodiments of the present invention.

Relative delay time differences between the delay output clock signals DOCLK1, DOCLK2, DOCLK3, . . . , DOCLKn+1 may be determined by an oscilloscope, which measures the time when the output signals ACOUT and the delay output clock signals DOCLK1, DOCLK2, DOCLK3, . . . , DOCLKn+1 reach the plurality of the semiconductor memory devices M1, M2, . . . , Mn. In other embodiments, the relative delay time differences between the delay output clock signals DOCLK1, DOCLK2, DOCLK3, . . . , DOCLKn+1 may be determined by a middle value of a pass region by writing the output signals ACOUT to and reading them from the plurality of semiconductor memory devices M1, M2, . . . , Mn with varying delay times. In still other embodiments, the delay time of the delay output clock signals DOCLK1, DOCLK2, DOCLK3, . . . , DOCLKn+1 may be determined by a middle value of a pass region by writing the output signals ACOUT to and reading them from the plurality of semiconductor memory devices M1, M2, . . . , Mn with varying delay times using a CPU. These methods of determining delay time may also be used in determining the delay information provided to a ROM through input signals ROMIN discussed above.

Figure 8:
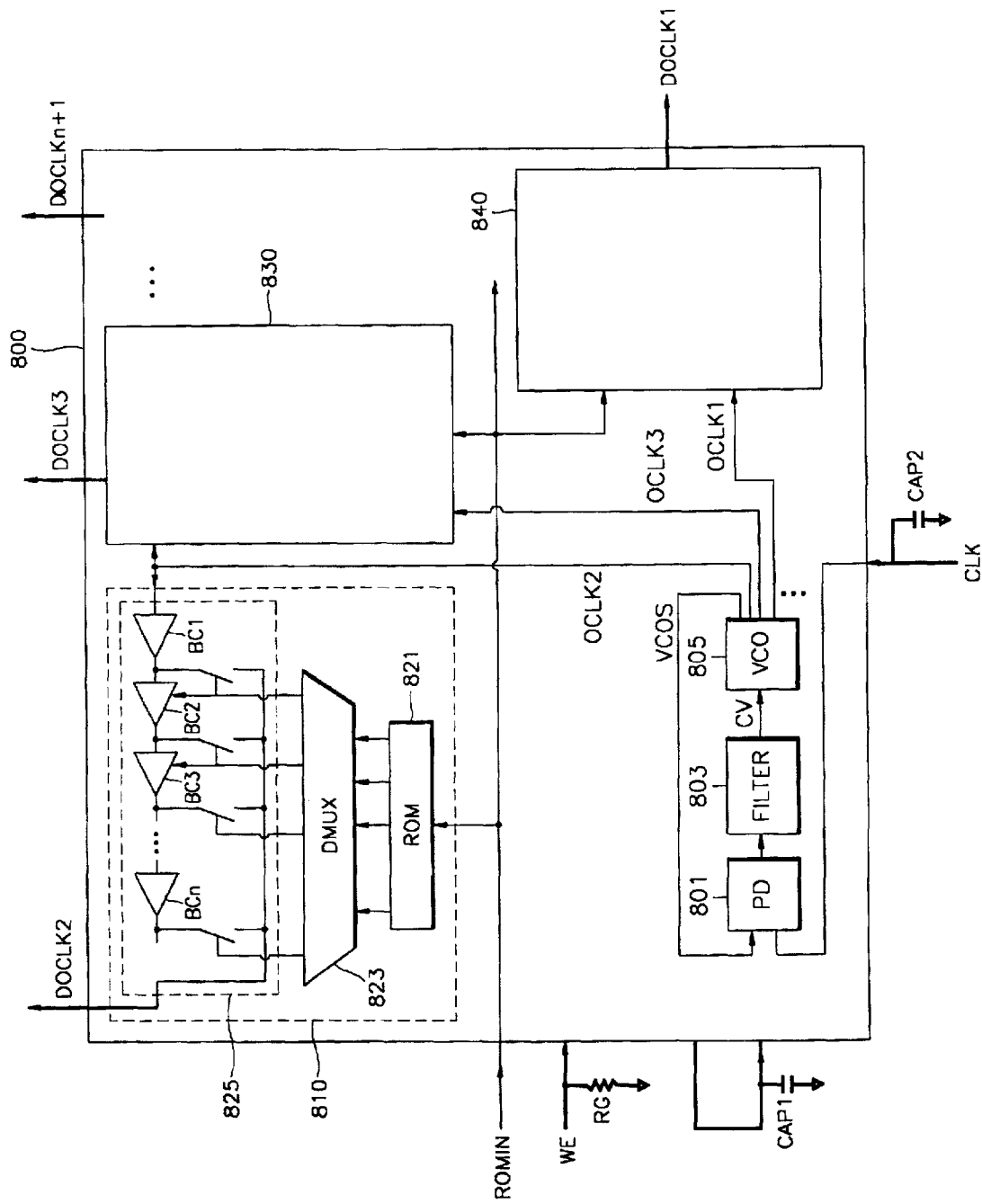
FIG. 8 is a circuit diagram of a clock generation circuit for use in the integrated circuit memory module of FIG. 7 in accordance with embodiments of the present invention.

Referring now to FIG. 8, a delay phase-locked loop 800 that may be used to implement the delay phase-locked loop 720 of FIG. 7 comprises a phase detector 801, a low-pass filter 803, a voltage control oscillator 805, and a plurality of delay modules 810, 830, and 840. The phase detector 801 outputs the phase difference between an input clock signal CLK and a voltage controlled oscillation signal VCOS. The low-pass filter 803 passes a phase difference signal output from the phase detector 801 to generate a control voltage CV. The voltage control oscillator 805 generates the voltage controlled oscillation signal VCOS and clock signals OCLK1, OCLK2, . . . , OCLKn+1 in response to the control voltage CV. In accordance with embodiments of the present invention, the clock signals OCLK1, OCLK2, . . . , OCLKn+1 have the same phase. The plurality of delay modules 810, 830, and 840 generate delay output clock signals DOCLK that each have a different delay time relative to each other in response to a ROM input signal ROMIN and output clock signals OCLK.

The delay modules 810, 830, and 840 have the same structure; therefore, only delay modules 810 will be described. The delay module 810 comprises a ROM 821, a demultiplexer 823, and a delay buffer 825. The ROM 821 receives and stores the ROM input signals ROMIN, which carry information on desired delay time, in response to a write control signal WE. The demultiplexer 823 generates a plurality of switch control signals based on the desired delay time information stored in the ROM 821. The delay buffer 825 comprises a plurality of buffers BC1, BC2, . . . BCn and a plurality of switches that are respectively operable in response to the switch control signals output from the demultiplexer 823 to connect selected ones of the plurality of buffers BC1, BC2, . . . BCn in series between the input terminal and the output terminal of the delay buffer 825. The delay buffer 825 generates the delay output clock signal DOCLK2, which is variably delayed based on the delay time information stored in the ROM 821, in response to the clock signal OCLK2.

Exemplary operations of the delay phase-locked loop 800, in accordance with embodiments of the present invention, will now be described with reference to FIG. 8. The phase detector 801 outputs the phase difference between an input clock signal CLK and a voltage controlled oscillation signal VCOS. The low-pass filter 803 passes a phase difference signal output from the phase detector 801 to generate a control voltage CV. The voltage control oscillator 805 generates the voltage controlled oscillation signal VCOS and clock signals OCLK1, OCLK2, . . . , OCLKn+1 in response to the control voltage CV. In accordance with embodiments of the present invention, the clock signals OCLK1, OCLK2, . . . , OCLKn+1 have the same phase.

The ROM input signal ROMIN, which carries information on the desired delay time for delaying the delay output clock signal DOCLK2 relative to the clock signal OCLK2, are written to the ROM 821. A program may provide the delay time information, which is carried by the ROM input signals ROMIN. The ROM input signal ROMIN is a series signal, which determines different delay times for each of the delay modules 810, 830, and 840. The ROM 821 is connected to the demultiplexer 823, which generates output signals corresponding to the desired delay time in response to signals output from the ROM 821. Signals output from the demultiplexer 823 are applied to the delay buffer 825, which comprises a plurality of buffers BC1, BC2, BC3, . . . , BCn.

The signals output from the demultiplexer 823 operate a plurality of switches, which are connected to the plurality of buffers BC1, BC2, BC3, . . . , BCn to connect selected ones of the plurality of buffers BC1, BC2, BC3, . . . , BCn in series between the input terminal and the output terminal of the delay buffer 825 to delay the delay output clock signal DOCLK2 relative to the clock signal OCLK2.

Unlike the embodiments of the present invention described above with reference to FIGS. 3–6, the ROM input signal ROMIN does not share input pins with the input signals ACIN; therefore, and the delay phase-locked loop 800 uses a separate terminal to receive the ROM input signal ROMIN.

The delay phase-locked loop 800 delays the delay output clock signals DOCLK1, DOCLK2, DOCLK3, . . . , DOCLKn+1 relative to each other, which are then applied to the plurality of semiconductor memory devices M1, M2, . . . , Mn and the register 730. This may allow setup and hold times, which vary when the output signals ACOUT are applied to the semiconductor memory devices M1, M2, . . . , Mn in synchronization with clock signals that are all in phase with one another, to be corrected to provide a large enough margin for the semiconductor memory devices M1, M2, . . . , Mn and reduce malfunctions in the plurality of semiconductor memory devices M1, M2, . . . , Mn.

As described above, the operation margin of a plurality of semiconductor memory devices may be reduced due to a reduction in setup and hold times of the input signals provided to the plurality of semiconductor memory devices. In accordance with embodiments of the present invention, however, the input signals may be generated in synchronization with a clock signal that is delayed relative to the clock signals used to drive the plurality of semiconductor memory devices or the clock signals used to drive the plurality of semiconductor devices may be generated to be out of phase with one another (or be delayed relative to each other) to reduce malfunctions in the plurality of semiconductor memory devices.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. An integrated circuit device, comprising:
   a delay circuit that is configured to delay a clock signal and is further configured to generate an output data signal in response to the delayed clock signal and an input data signal, the delay circuit comprising:
- a memory unit that is configured to store delay information therein;
- a delay buffer that is coupled to the memory unit and is configured to generate the delayed clock signal at an output terminal thereof in response to the delay information and the clock signal received at an input terminal thereof; and
- a receiver circuit that is configured to store the input data signal and to generate the output data signal in response to the delayed clock signal and the stored input data signal;

an input terminal that is coupled to both the receiver circuit and the memory unit and is configured to receive the input data signal and the delay information therethrough; and a plurality of devices that are configured to respectively receive the output data signal in response to the clock signal.

2. The integrated circuit device of claim 1, wherein the delay buffer comprises:
- a plurality of buffers; and
- a plurality of switches that are respectively operable to connect selected ones of the plurality of buffers in series between the input terminal and the output terminal of the delay buffer.

3. The integrated circuit device of claim 2, wherein the delay circuit further comprises:
- a demultiplexer circuit that couples the memory unit to the delay buffer and is configured to generate a plurality of switch control signals, respective ones of the plurality of switches being responsive to the respective ones of the plurality of switch control signals.

4. The integrated circuit device of claim 1, wherein the plurality of devices comprises memory devices.

5. The integrated circuit device of claim 1, further comprising:
- a clock generation circuit that is configured to generate the clock signal in response to an input clock signal.

6. The integrated circuit device of claim 5, wherein the clock generation circuit is a phase locked loop circuit.

7. The integrated circuit device of claim 5, respective ones of the plurality of devices have different respective delays associated therewith with respect to receiving the output data signal.

8. An integrated circuit device, comprising:
a delay circuit that is configured to receive an input data signal in response to a clock signal and is further configured to generate an output data signal by delaying the input data signal, the delay circuit comprising:
- a memory unit that is configured to store delay information therein;
- a delay buffer that is coupled to the memory unit and is configured to generate the output data signal at an output terminal thereof in response to the delay information and the input data signal received at an input terminal thereof; and
- a receiver circuit that is configured to store the input data signal in response to the clock signal;

an input terminal that is coupled to both the receiver circuit and the memory unit and is configured to receive the input data signal and the delay information therethrough; and a plurality of devices that are configured to respectively receive the output data signal in response to the clock signal.

9. The integrated circuit device of claim 8, wherein the delay buffer comprises:
- a plurality of buffers; and
- a plurality of switches that are respectively operable to connect selected ones of the plurality of buffers in series between the input terminal and the output terminal of the delay buffer.

10. The integrated circuit device of claim 9, wherein the delay circuit further comprises:
- a demultiplexer circuit that couples the memory unit to the delay buffer and is configured to generate a plurality of switch control signals, respective ones of the plurality of switches being responsive to the respective ones of the plurality of switch control signals.

11. The integrated circuit device of claim 8, wherein the plurality of devices comprises memory devices.

12. The integrated circuit device of claim 8, further comprising:
- a clock generation circuit that is configured to generate the clock signal in response to an input clock signal.

13. The integrated circuit device of claim 12, wherein the clock generation circuit is a phase locked loop circuit.

* * * * *